(12) United States Patent
Miglani et al.

(10) Patent No.: US 11,139,799 B2
(45) Date of Patent: Oct. 5, 2021

(54) CLOCK FILTER WITH NEGATIVE RESISTOR CIRCUIT

(71) Applicant: TEXAS INSTRUMENTS INCORPORATED, Dallas, TX (US)

(72) Inventors: Eeshan Miglani, Chhindwara (IN); Shagun Dusad, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/943,561

(22) Filed: Jul. 30, 2020

(65) Prior Publication Data

US 2021/0119612 A1    Apr. 22, 2021

(30) Foreign Application Priority Data

Oct. 18, 2019    (IN) .............................. 201941042294

(51) Int. Cl.
*H03H 11/12*    (2006.01)
*G06F 1/10*    (2006.01)
*H03K 19/20*    (2006.01)

(52) U.S. Cl.
CPC ........... *H03H 11/1213* (2013.01); *G06F 1/10* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 6,575,044 B1 * | 6/2003 | Feller | G01F 1/662 73/861.27 |
| 9,209,907 B2 * | 12/2015 | Guckenberger | H04B 10/2575 |
| 9,413,341 B1 * | 8/2016 | Ho | H03B 5/368 |
| 2014/0022008 A1 * | 1/2014 | Noorlag | G01R 31/2856 327/540 |
| 2018/0083443 A1 * | 3/2018 | Mertens | H02H 9/046 |
| 2020/0241843 A1 * | 7/2020 | Hershman | G06F 7/588 |

* cited by examiner

*Primary Examiner* — Cassandra F Cox
(74) *Attorney, Agent, or Firm* — John R. Pessetto; Charles A. Brill; Frank D. Cimino

(57) ABSTRACT

A circuit includes a filter, a first inverter, and a second inverter. The filter is coupled to an input of the first inverter. The second inverter includes an input and an output. The input of the second inverter is coupled to the output of the first inverter. The output of the second inverter is coupled to the input of the first inverter.

16 Claims, 3 Drawing Sheets

CLOCK FILTER WITH NEGATIVE RESISTOR CIRCUIT

CROSS-REFERENCE TO RELATED APPLICATIONS

This application claims priority to India Provisional Application No. 201941042294, filed Oct. 18, 2019, which is hereby incorporated by reference.

BACKGROUND

In many applications, an integrated circuit ("chip") includes an internal clock signal that is routed to different functional circuits implemented on the same semiconductor die. Such functional circuits include, for example, transmitters and receivers. The co-existence of other digital signals on the chip can degrade the dock signal (e.g., creating jitter and spurious tones) that is routed across the chip. Further, routing buffers for the dock signal also can add noise and add to the power consumption of the chip.

SUMMARY

In one example, a circuit includes a filter and a negative resistor circuit. The negative resistor circuit is coupled to an output of the filter.

In another example, a circuit includes a filter, a first inverter, and a second inverter. The filter is coupled to an input of the first inverter. The second inverter includes an input and an output. The input of the second inverter is coupled to the output of the first inverter. The output of the second inverter is coupled to the input of the first inverter.

In yet another example, a circuit includes first, second, and third inverters, a filter, a capacitor, and a switch. The filter is coupled to the output of the inverter. The input of the second inverter is coupled to the filter. The input of the third inverter is coupled to the output of the second inverter. The output of the third inverter is coupled to the input of the second inverter. The switch is coupled between the capacitor and the output of the first inverter.

BRIEF DESCRIPTION OF THE DRAWINGS

For a detailed description of various examples, reference will now be made to the accompanying drawings in which.

DETAILED DESCRIPTION

Figure 1:
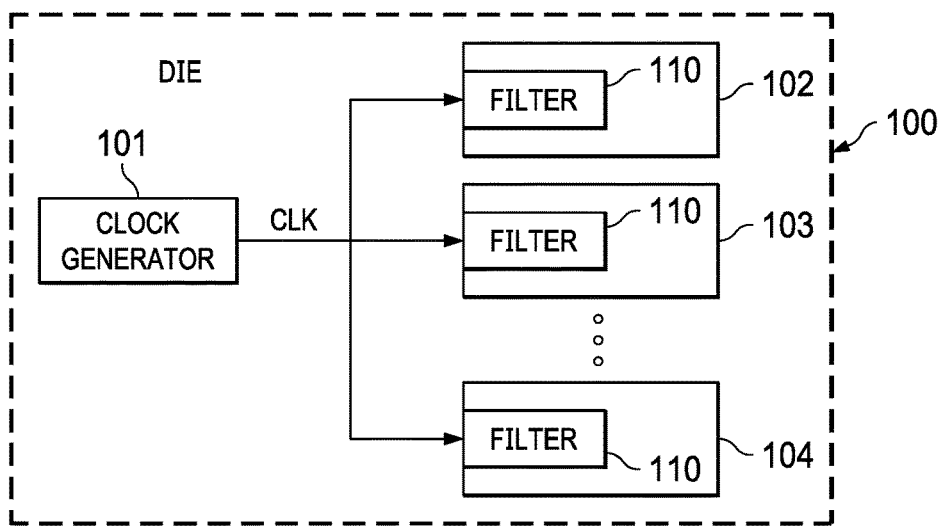
FIG. 1 illustrates a semiconductor die including a clock filter for each of multiple functional circuits that use a clock routed across the die.

FIG. 1 shows an example of semiconductor die ("chip") comprising a clock generator 101 and multiple functional circuits 102, 103, and 104. Any of the functional circuits 102-104 may comprise a transmitter, a receiver, or other type of circuit. Although three functional circuits 102-104 are shown in the example of FIG. 1, fewer than three or more than three functional circuits can be provided in other implementations. Each of the functional circuits shown in FIG. 1 use a clock signal (CLK) generated by the clock generator 101 and routed across the die 100. CLK may be infected with noise as it traverses the die 100. Each functional circuit 102-104 includes (or is coupled to) a clock filter 110. The clock filter 110 is a bandpass filter whose center frequency equals the frequency of CLK. The clock filter 110 passes through CLK while attenuating noise and other spurious signals at other frequencies. The examples described herein are directed to a clock filter that has a relatively high quality factor (Q). Q is given by the ratio of frequency to bandwidth, that is the frequency of CLK divided by the 3 dB-based bandwidth of the filter. As will be seen below, the clock filter 110 includes a negative resistance circuit to help increase the filter's Q.

Figure 2:
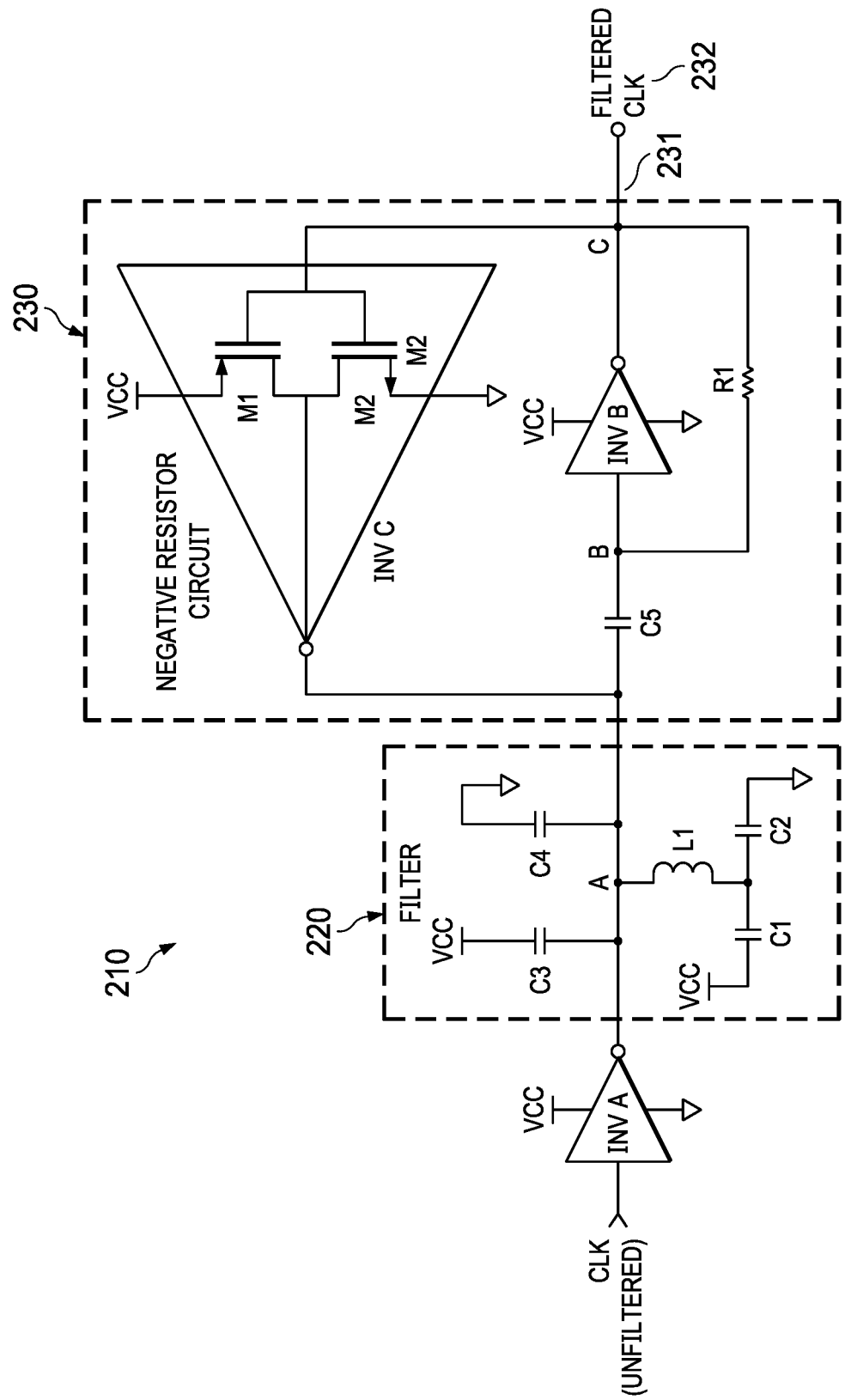
FIG. 2 shows one example implementation of the clock filter.

FIG. 2 shows an example of a clock filter circuit 210 that can be used to implement clock filter 110 of FIG. 1. The example clock filter circuit 210 includes an inverter INV A, a filter 220, and a negative resistor circuit 230. The input of INV A receives the clock signal to be filtered (unfiltered CLK). The filter 220 is coupled to the output of INV A. The negative resistor circuit 230 is coupled to the filter 220 and to the output of INV A as shown. The output 231 of the negative resistor circuit 230 provides the filtered clock signal 232.

The filter 220 includes capacitors C1, C2, C3, and C4, and inductor L1. C3 is coupled between the supply voltage node (VCC) and the output of INV A at node A. C3 is coupled between node A and ground. One terminal of L1 is coupled to node A and the other terminal of L1 is coupled to terminals of C1 and C2. The other terminals of C1 and C2 are coupled to VCC and to ground, respectively, as shown. The combination of C3, C4, and L1 form a bandpass filter whose center frequency is tuned to equal the frequency of CLK. The combination of C1, C2, and L1 form a notch filter tuned to attenuate a signal at the center frequency of the notch filter. In one example, the die 100 may have another clock signal (besides CLK) at a much different frequency than CLK, and the notch filter implemented by filter 220 may be tuned to attenuate any crosstalk noise that infects CLK from the other clock signal.

In one example, CLK has a frequency of 3 GHz and another clock frequency on the die has a frequency of 750 MHz. As such, the bandpass filter of filter 220 is tuned to 3 GHz and the notch filter within filter 220 is tuned to 750 MHz. As such, between the bandpass filter centered at the frequency of CLK (e.g. 3 GHz) and the notch filter centered at a frequency of another clock on the die (e.g., 750 MHz), the filter 220 of the clock filter circuit 210 passes through CLK to the functional circuit (e.g., 102, 103, 104), while attenuating other frequencies including the frequency of another specific clock that happens to be present on the same die.

In one implementation the capacitance of C1 equals that of C2, and the capacitance of C3 equals that of C4. Equation (1) below relates the capacitance of an LC bandpass (or notch) filter to the desired center frequency of the filter:

$$\frac{1}{\sqrt{(2*L1*C)}} = 2\pi f \qquad (1)$$

where f is the desired center frequency. The value of C in equation (1) can be computed for the bandpass filter at a desired center frequency to thereby provide the capacitance of C3 and C4. Similarly, the value of C in equation (1) can be computed for the notch filter at a desired center frequency to thereby provide the capacitance of C1 and C2. For a bandpass filter having a center frequency of 3 GHz and notch filter having a center frequency at 750 MHz, the value of C3 and C4 equals 1.5 picofarads and the value of C1 and C2 equals 22.5 picofarads for an inductance of L1 of 1 nanohenry.

The Q of the bandpass filter implemented by filter 220 may not be as high as may be desirable. As will be explained below, the negative resistor circuit 230 helps to provide the overall clock filter circuit 210 with a Q value that is higher than the Q value of just the filter 220.

The negative resistor circuit 230 includes inverters INV B and INV C, capacitor C5, and resistor R1. Capacitor C5 is coupled between the filter 220/output of inverter INV A and the input of inverter INV B. The node coupling capacitor C5 to the input of inverter INV B is labeled node B. The output of inverter INV B (node C) is coupled to the input of inverter INV C. The output of inverter INV C is coupled to node A. As such, the input of inverter INV B is coupled to node B (and thus to one terminal of C5), and the output of inverter INV C is coupled to node A (and thus to the other terminal of C5).

Inverters A and B implement a negative resistor. Each inverter comprises a transistor pair. The transistor pair is shown for inverter INV C, and the configuration may be the same for the other inverters. The transistor pair comprises a p-type metal oxide semiconductor field effect transistor (PMOS) M1 and an n-type metal oxide semiconductor field effect transistor (NMOS) M2. The source of M1 is coupled to VCC and the source of M2 is coupled to ground. The gates of M1 and M2 are coupled together to thereby provide the input to the inverter. The drains of M1 and M2 also are coupled together to provide the output of the inverter. The gates of M1 and M2 are thus coupled to node C and the drains of M1 and M2 are coupled to node A. When the voltage on node C is high, M2 turns on and M1 turns off. With M2 on and its source coupled to ground, the voltage on the drain of M2 is pulled low. Reciprocally, when the voltage on node C is low, M1 turns on and M2 turns off. With M1 on and its source coupled to VCC, the voltage on the drain of M1 is pulled high.

As the voltage on node A rises (due to a falling edge of unfiltered CLK on the input of inverter INV A), the voltage on node B also rises. As a result of the inversion implemented by inverter INV B, the voltage on node C falls. With the voltage on node C falling, the gate-to-source voltage (Vgs) of PMOS increases thereby turning M1 on "harder" (i.e., causing more drain current flow from VCC through M1 to the node A. Further, the voltage on the drain of M1 also is pulled high due to M1 being on. Thus, as the voltage on node A increases due to a falling edge of unfiltered clock A and the inversion caused by inverter INV A), inverter INV C also operates to pull up the voltage on node A and inject current from M1 into node A. The opposite operation occurs for a falling edge on node A-M2 is turned on harder and current is removed from node A through M2 to ground. Inverters INV B and INV C thus operate to assist in increasing the slew rate of the rising and falling edges on node A, which results in an increase in the Q value of clock circuit 210 relative to just the Q value of filter 220.

Further, with the inverters INV B and INV C of the negative resistor circuit 230, the "size" of inverter A can be made smaller than would otherwise be the case without the negative resistor circuit 230. The size of an inverter refers to the amount of current it can source or sink. For example, inverter A may be implemented as multiple PMOS/NMOS transistor pairs connected in parallel. With the inclusion of the negative resistor circuit 230 to source/sink extra current to/from node A, inverter A need provide as much current and thus can be implemented in a smaller size.

In general, with two inverters connected in a ring (output of each inverter coupled to the input of the other inverter, the voltages on the output of each inverter will be fixed. For example, if the input of inverter INV B is low, the output of inverter B will be high. Inverter C reinforces those voltage states by inverting the high output of inverter B to reinforce the logic low input of inverter B. As such, there is a risk that the voltage on node A may become "stuck" (either logic low or high). This risk is present particularly as the drive strength of inverters INV B and INV C may be greater than the drive strength of inverter INV A. That is, a competition may be present as inverter INV A is trying to toggle its output on node A high and low in response to the unfiltered CLK input signal, but INV B and INV C may dominate and cause the voltage on node A to become stuck.

Capacitor C5 and resistor R1 help to prevent this condition. The average current through C5 is 0 amperes, and because the current through C5 also flows through R1, the average current through R1 also is 0 amperes. The average current through R1 can only be zero if the average voltage across R1 is zero meaning that the average voltage of node B equals the average voltage of node C. In an inverter (e.g., INV B), the output voltage is opposite that of that of the input (i.e., if input equals 0, output is VCC, and vice versa). As such, the only possible voltage for node B and node C is VCC/2. C5 and R1 thereby ensure that the waveform on node B has an average value that is approximately one-half VCC. The threshold voltage of inverter INV B also is VCC/2. If the average voltage on node B were permitted to be substantially different than the threshold voltage of inverter INV B, the risk would be substantial that the negative resistor circuit 230 would overwhelm inverter INV A to cause the voltages on nodes A and B to be stuck at VCC or ground. However, C5 reduces the DC bias in the waveform of node B from passing through to node B and thus avoids the voltage on nodes A, B, and C from becoming stuck.

Either or both of the power supply node (VCC) and ground nodes may experience noise. Thus, power supply/ground noise may be present on node A due to filter 220 being coupled to VCC. The threshold voltage of inverter INV B is a function of VCC, and thus any noise on VCC or ground also changes the threshold voltage of the inverter. Advantageously, the change in the threshold voltage of inverter INV B tracks any change in the voltage on node A due to power supply/ground noise thereby rendering the clock filter 210 generally immune from power supply and ground noise.

Figure 3:
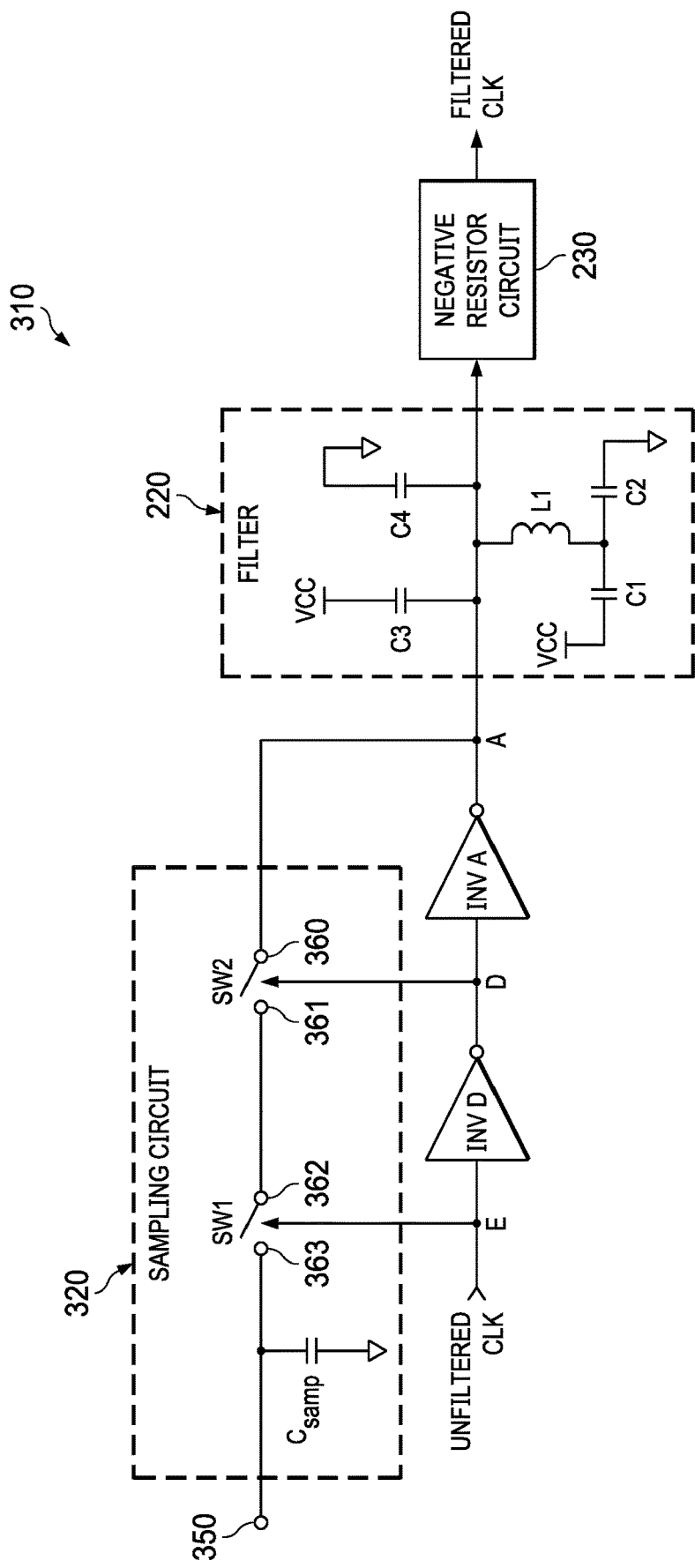
FIG. 3 shows another example implementation of a clock filter having a sampling circuit usable to tune the center frequency of the filter.

FIG. 3 shows an example of a clock filter circuit 310 that can be used to implement clock filter 110 of FIG. 1. Clock filter circuit 310 is similar to clock filter circuit 210 of FIG. 2. Clock filter circuit 310 includes inverter INV A, filter 220, and the negative resistor circuit 230. The components implementing negative resistor circuit 230 are not shown in FIG. 3 for simplicity, but the negative resistor circuit 230 in FIG. 3 may be implemented the same as that shown in FIG. 2. The clock filter circuit 310 of FIG. 3 also includes inverter INV D and a sampling circuit 320. The output of inverter INV D is coupled to the input of INV A (node D). The input of inverter D is designated node E. Node E receives the unfiltered clock which is then inverted twice—once by inverter INV D and again by inverter INV A.

The sampling circuit 320 includes switches SW1 and SW2 and capacitor Csamp. Each switch comprises switch terminals and a control terminal. Switch terminal 360 of SW2 is coupled to node A (output of inverter INV A) and the other switch terminal of SW2 (switch terminal 361) is coupled to switch terminal 362 of SW1. The other switch terminal of SW1 (switch terminal 363) is coupled to Csamp. Csamp is charged to (or begins to charge toward) the voltage on node A when both switches SW1 and SW2 are closed (ON). When at least one of SW1 and SW2 is open (off), Csamp maintains the voltage to which it has been charged. An externally-accessible pin 350 is provided on the die containing the clock filter circuit 310. Pin 350 is coupled to Csamp and thus the voltage on node A can be monitored by measuring (by an external measurement device) the voltage on pin 350.

The control input of SW2 is coupled to the output of inverter INV D. The control input of SW1 is coupled to the input of inverter INV D. Thus, the unfiltered CLK signal controls SW1 and the inverted version of the unfiltered CLK on node D controls SW2. In one example, SW1 and SW2 are closed (turned on), when their respective control signals are high. When the unfiltered CLK on node E is low, the signal on node D is high. In that state, SW2 is closed and SW1 is open. Due to a small propagation delay through inverter INV D (as is the case for all inverters), there is a brief moment during each cycle of CLK in which the signal on nodes E and D are both high. That is, when the unfiltered CLK signal transitions from low to high and before the signal on node D changes from high to low, both node E and node D are at a high enough voltage that both switches SW1 and SW2 are closed. With both switches simultaneously closed, Csamp receives the voltage on node A and begins to charge to that voltage.

Due to the bandpass frequency response of filter 220 coupled to node A, a sinewave (or at least an approximate sinewave) voltage is present on node A. When the filter is properly tuned to have a center frequency equal to the frequency of CLK, the imaginary component of admittance is equal to 0. Thus, there will be a 180-degree phase difference from node D to node A at the fundamental frequency of CLK. This means that at a falling edge at node D, node A will be rising and will be near VCC/2. Thus, Csamp stores voltage equal to Vcc/2. If the capacitive admittance is more than inductive admittance, there will be a phase lag at node A, which results in node A being less than VCC/2, thereby resulting in the sampled voltage at Csamp being less than Vcc/2. Similarly, when the capacitive admittance is lower, Csamp will sample a voltage greater than Vcc/2.

A sampled voltage on Csamp that is larger or smaller than VCC/2 indicates that the inductive reactance does not match the reactive inductance of the LC-based filter. If the sampled voltage is greater than VCC/2, the reactive inductance is larger than the reactive capacitance and the capacitance of C3 and C4 should be increased to make the reactive inductance more closely match the reactive capacitance. Conversely, if the sampled voltage is less than VCC/2, the reactive inductance is smaller than the reactive capacitance and the capacitance of C3 and C4 should be decreased.

Figure 4:
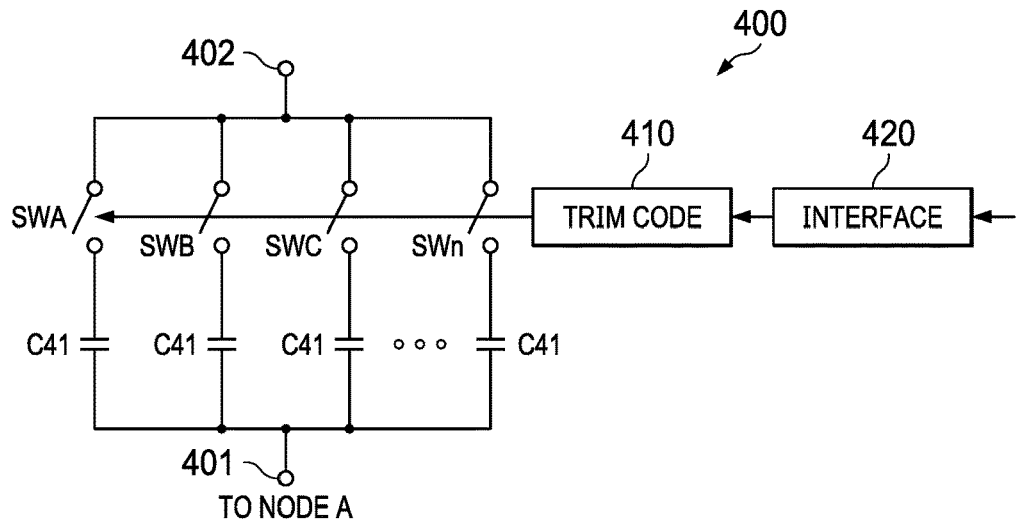
FIG. 4 shows an example implementation of a trimmable capacitor for use in the filter.

Capacitors C3 and C4 are trimmable in this example. That is, C3 and C4 can be trimmed to a desired value. In one example, a trim value is determined, stored on the die, and used to trim both C3 and C4, and not to trim C3 separately from C4. FIG. 4 shows an example implementation for a trimmable capacitor 400 that can be used to implement C3 and C4. The trimmable capacitor 400 includes multiple unit capacitors C41 and corresponding switches SWA, SWB, SWC, . . . , SWn. Each unit capacitor C41 is coupled to a respective switch. The series combination of each switch and unit capacitance C41 is coupled between terminals 401 and 402. To implement capacitor C3, terminal 401 is coupled to node A (FIGS. 2/3) and terminal 401 is coupled to VCC. To implement capacitor C4, terminal 401 is coupled to node A and terminal 401 is coupled to ground. Trim code storage 410 is provided on the die into which a trim code can be stored. The trim code may be provided to the trim code storage 410 from an interface 420 provided on the die. The interface (e.g., a serial interface) can be coupled to an external device which transmit the trim code to the interface 420.

The trim code is used to control the on/off states of the switches SWA-SWn. Controlling the switches enables the use of a single unit capacitance C41 or two or more unit capacitances can be coupled in parallel between nodes 401 and 402. The overall effective capacitance (between nodes 401 and 402) of capacitors in parallel is the sum of the respective unit capacitances. For example, if a capacitance of three times the unit capacitance is needed to properly tune the bandpass filter of filter 220, then three of the switches (e.g., SWA, SWB, and SWC) are closed to place three unit capacitances C41 in parallel.

Figure 5:
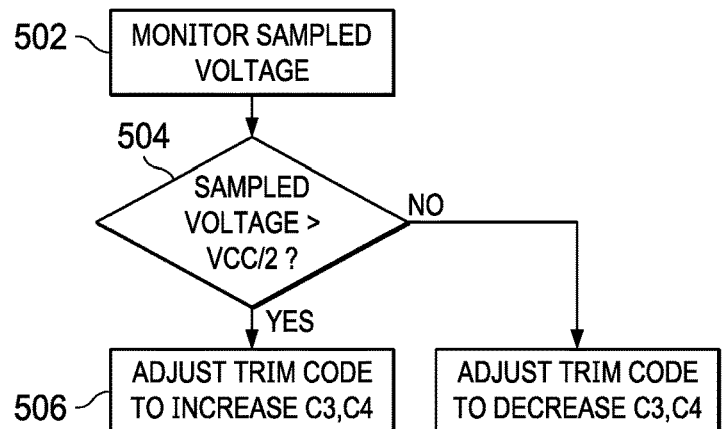
FIG. 5 is an example of a method to trim the filter.

FIG. 5 shows an example of a method usable to trim capacitors C3 and C4 to tune the center frequency of the bandpass filter to coincide with frequency of CLK. At 502, the voltage of Csamp is monitored. This operation may include the use of an external electrical device to measure the voltage on pin 350, which is coupled Csamp as explained above. At 504, the method includes determining whether the sampled voltage is larger or smaller than VCC/2, or in some examples, whether the sampled voltage is larger by at least a predefined threshold amount or smaller by at least a threshold amount from VCC/2. If the sampled voltage is larger than VCC/2, the method includes at 506 adjusting the trim code so as to increase the capacitance of C3 and C4 (e.g., change the trim code so as to turn on one or more additional switches in FIG. 4). If the sampled voltage is smaller than VCC/2, the method includes at 508 adjusting the trim code so as to decrease the capacitance of C3 and C4 (e.g., change the trim code so as to turn off one or more switches in FIG. 4). The process of FIG. 5 may be repeated until the sampled voltage is within a predefined range of VCC/2 (e.g., between 0.4VCC and 0.6VCC.

The term "coupled" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
   a filter having an output;
   a first inverter having an input and output, the input of the first inverter coupled to the output of the filter; and a second inverter having an input and output, the input of the second inverter coupled to the output of the first inverter, and the output of the second inverter coupled to the input of the first inverter;

further comprising a third inverter having an input and an output, the output of the inverter coupled to the filter.

2. A circuit, comprising:

a filter having an output;

a first inverter having an input and output, the input of the first inverter coupled to the output of the filter; and a second inverter having an input and output, the input of the second inverter coupled to the output of the first inverter, and the output of the second inverter coupled to the input of the first inverter;

further comprising a capacitor coupled between the filter and the input of the first inverter.

3. A circuit, comprising:

a filter having an output;

a first inverter having an input and output, the input of the first inverter coupled to the output of the filter; and a second inverter having an input and output, the input of the second inverter coupled to the output of the first inverter, and the output of the second inverter coupled to the input of the first inverter;

further including:

a third inverter having an input and an output, the output of the inverter coupled to the filter; and a sampling circuit coupled to the output of the third inverter, the sampling circuit including a switch and a capacitor.

4. A circuit, comprising:

a filter having an output;

a first inverter having an input and output, the input of the first inverter coupled to the output of the filter; and a second inverter having an input and output, the input of the second inverter coupled to the output of the first inverter, and the output of the second inverter coupled to the input of the first inverter;

further including:

a third inverter having an input and an output, the output of the third inverter coupled to the filter;

a fourth inverter having an input and an output, the output of the fourth inverter coupled to the input of the third inverter;

a first switch having first and second terminals and a control input, the first terminal coupled to the output of the third inverter, and the control input coupled to the output of the fourth inverter;

a second switch having first and second terminals and a control input, the first terminal of the second switch coupled to the second terminal of the first switch, and the control input of the second switch coupled to the input of the fourth inverter; and a capacitor coupled to the second terminal of the second switch.

5. The circuit of claim 4, wherein:

the first fourth inverters, the filter, the first and second switches, and the capacitor are provided on a same semiconductor die; and the die including an externally-accessible pin coupled to the capacitor.

6. The circuit of claim 4, wherein the filter includes a bandpass filter and the circuit further includes storage for a trim code to adjust a center frequency of the bandpass filter.

7. A circuit, comprising:

a first inverter having an input and an output;

a filter coupled to the output of the inverter; and a second inverter having an input and an output, the input of the second inverter coupled to the filter; and a third inverter having an input and an output, the input of the third inverter coupled to the output of the second inverter, and the output of the third inverter coupled to the input of the second inverter.

8. The circuit of claim 7, further comprising a capacitor coupled between the output of the third inverter and the input of the second inverter.

9. The circuit of claim 8, further comprising a resistor coupled between the input of the second inverter and the output of the second inverter.

10. The circuit of claim 7, wherein the filter includes a bandpass filter.

11. The circuit of claim 7, further including a sampling circuit coupled to the output of the first inverter, the sampling circuit including a first switch and a capacitor.

12. The circuit of claim 11, further including a second switch coupled between the first switch and the capacitor.

13. A circuit, comprising:

a first inverter having an input and an output;

a filter coupled to the output of the first inverter; and a second inverter having an input and an output, the input of the second inverter coupled to the filter;

a third inverter having an input and an output, the input of the third inverter coupled to the output of the second inverter, and the output of the third inverter coupled to the input of the second inverter;

a capacitor; and a first switch coupled between the capacitor and the output of the first inverter.

14. The circuit of claim 13, further comprising:

a capacitor coupled between the output of the third inverter and the input of the second inverter; and a resistor coupled between the input of the second inverter and the output of the second inverter.

15. The circuit of claim 13, further comprising:

a fourth inverter having an input and an output, the output of the fourth inverter coupled to the input of the first inverter; and a second switch coupled between the capacitor and the first switch, the second switch having a control input coupled to the input of the fourth inverter;

wherein the first switch has a control input coupled to the output of the fourth inverter.

16. The circuit of claim 13, wherein the filter includes a bandpass filter.

* * * * *